(12) United States Patent
Yi

(10) Patent No.: US 7,129,154 B2
(45) Date of Patent: Oct. 31, 2006

(54) METHOD OF GROWING SEMICONDUCTOR NANOWIRES WITH UNIFORM CROSS-SECTIONAL AREA USING CHEMICAL VAPOR DEPOSITION

(75) Inventor: Sung Soo Yi, Los Altos, CA (US)

(73) Assignee: Agilent Technologies, Inc, Santa Clara, CA (US)

( * ) Notice: Subject to any disclaimer, the term of this patent is extended or adjusted under 35 U.S.C. 154(b) by 174 days.

(21) Appl. No.: 10/857,191

(22) Filed: May 28, 2004

(65) Prior Publication Data

US 2005/0266662 A1    Dec. 1, 2005

(51) Int. Cl.
*H01L 21/36* (2006.01)
*H01L 21/20* (2006.01)

(52) U.S. Cl. .................. 438/504; 977/762; 977/818

(58) Field of Classification Search .............. 438/504
See application file for complete search history.

(56) References Cited

U.S. PATENT DOCUMENTS 5,338,389 A * 8/1994 Nishizawa et al. .......... 117/89
2005/0133476 A1* 6/2005 Islam et al. ................. 216/2

* cited by examiner

*Primary Examiner*—Asok Kumar Sarkar

(57) ABSTRACT

A nanowire of a semiconductor material and having a uniform cross-sectional area along its length is grown using a chemical vapor deposition process. In the method, a substrate is provided, a catalyst nanoparticle is deposited on the substrate, a gaseous precursor mixture comprising a constituent element of the semiconductor material is passed over the substrate, and adatoms of the constituent element are removed from a lateral surface of the nanowire during the passing of the precursor mixture. The removing comprises passing over the substrate a gaseous etchant that forms a volatile compound with the adatoms, the gaseous etchant comprising a halogenated hydrocarbon. Removing the adatoms of the constituent element before such adatoms are incorporated into the nanowire prevents such adatoms from accumulating on the lateral surface of the nanowire and allows the nanowire to grow with a uniform cross-sectional area along its length.

16 Claims, 3 Drawing Sheets

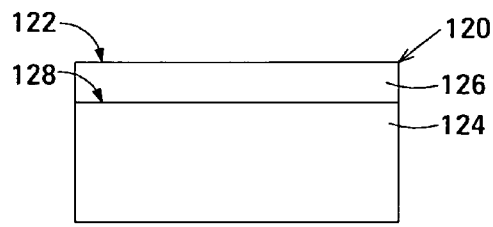
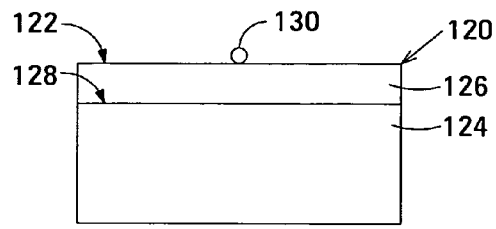
FIG.3A      FIG.3B
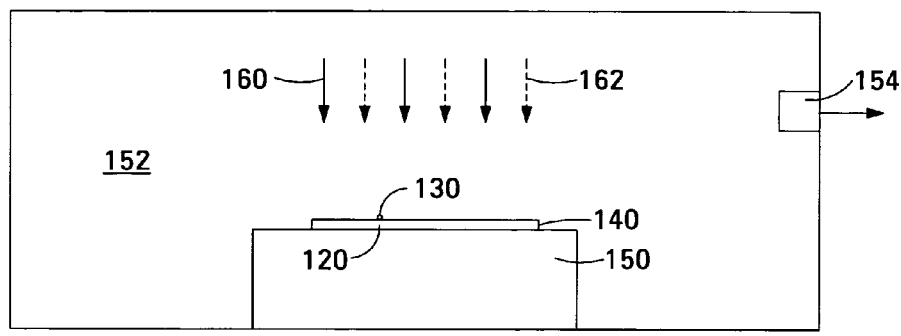
FIG.3C
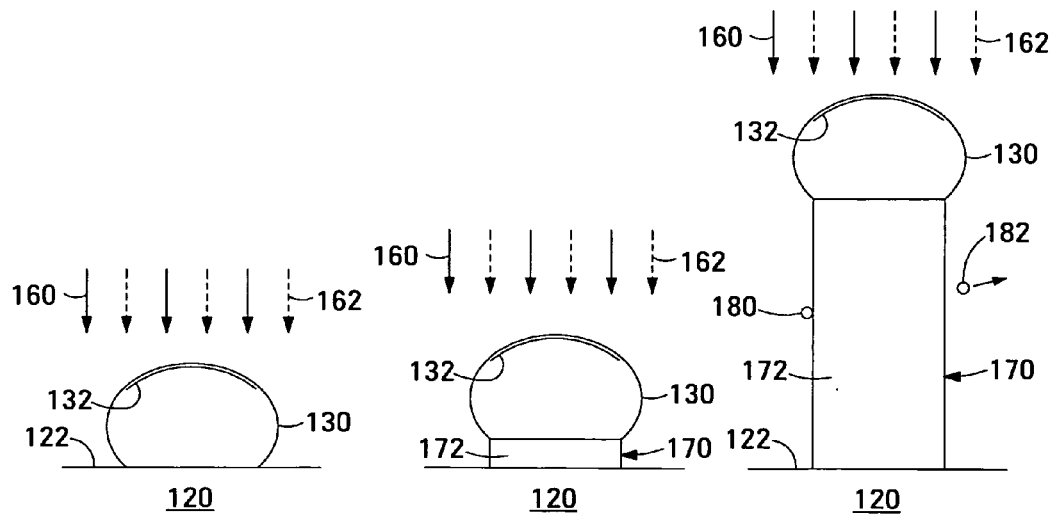
FIG.3D    FIG.3E    FIG.3F

METHOD OF GROWING SEMICONDUCTOR NANOWIRES WITH UNIFORM CROSS-SECTIONAL AREA USING CHEMICAL VAPOR DEPOSITION

BACKGROUND

Semiconductor nanowires are elongate structures having at least one dimension in the range from about 1 nm and 100 nm. Nanowires are nanoscale building blocks useable in such applications as nanoscale electronic devices and nanoscale photonic devices. Semiconductor nanowires allow such devices to be fabricated without the need for advanced lithographic techniques. The electrical and optical properties of the nanowires are strongly affected by the nanowires' diameter and cross-sectional shape. Some applications require the synthesis of nanowires with well-controlled diameters and cross-sectional shapes.

A number of different methods have been used to grow semiconductor nanowires. Some of the available methods are described by Younan Xia et al. in *One-Dimensional Nanostructures: Synthesis, Characterization and Applications*, 15 ADV. MATER. 353–389 (March 2003). Vapor-liquid-solid (VLS) growth is one method widely used to synthesize nanowires. A typical VLS process involves the catalytic decomposition of gaseous precursors on the surface of metal catalyst nanoparticles and the subsequent nucleation and growth of single-crystal nanowires. A number of different processes exist that employ VLS growth. These include laser ablation, chemical beam epitaxy and chemical vapor deposition (CVD).

Chemical vapor deposition processes such as metal-organic chemical vapor deposition (MOCVD) are widely used in the semiconductor industry for depositing layers of semiconductor materials. CVD reactors are commercially available, as are high-purity precursors for most single-element and compound semiconductor materials and p-type and n-type dopants for such materials. However, attempts to grow nanowires by MOCVD have typically yielded nanowires that taper significantly. Such nanowires progressively decrease in cross-sectional area along their length from base to tip. Such nanowires therefore have non-uniform cross-sectional areas and are therefore unsuitable for use in applications that need nanowires with a uniform cross-sectional area along their length.

Nanowires grown by laser ablation and chemical beam epitaxy have been reported as having substantially uniform cross-sectional areas. However, laser ablation employs equipment and processes that are not useable for other purposes, and laser ablation typically cannot be used to fabricate other parts of a device of which the nanowires would form part. Chemical beam epitaxy is not commonly used in industrial semiconductor manufacture.

What is needed, therefore, is a way of using a chemical vapor deposition process to grow nanowires that consistently have a uniform cross-sectional area along their length.

SUMMARY OF THE INVENTION

In a first aspect, the invention provides a method of growing a nanowire of semiconductor material. The nanowire has a constant cross-sectional area along its length. In the method, a substrate is provided, a catalyst nanoparticle is deposited on the substrate, a gaseous precursor mixture comprising a constituent element of the semiconductor material is passed over the substrate, and adatoms of the constituent element are removed from a lateral surface of the nanowire during the passing of the gaseous precursor mixture over the substrate. The removing comprises passing over the substrate a gaseous etchant that forms a volatile compound with the adatoms, the gaseous etchant comprising a halogenated hydrocarbon.

In an embodiment, the semiconductor material is a compound semiconductor material comprising constituent elements, the precursor mixture comprises the constituent elements, and adatoms of at least one of the constituent elements are removed from the lateral surface of the nanowire.

In a second aspect, the invention provides a method of growing a nanowire of a semiconductor material. The nanowire has a constant cross-sectional area along its length. In the method, a substrate is provided, a catalyst nanoparticle is deposited on the substrate, and a gaseous precursor mixture and a gaseous etchant are passed over the substrate. The precursor mixture comprises a constituent element of the semiconductor material. The etchant comprises a halogenated hydrocarbon.

Removing the adatoms of the constituent element from the lateral surface of the nanowire as the nanowire is grown and before such adatoms are incorporated into the nanowire prevents such adatoms from accumulating on the lateral surface of the nanowire and allows the nanowire to grow with a uniform cross-sectional area along its length.

BRIEF DESCRIPTION OF THE DRAWINGS

FIG. 3A is a side view of a substrate on which the nanowire will be grown.

FIG. 3B is a side view of the substrate shown in FIG. 3A showing a nanoparticle of a catalyst material on its major surface.

FIG. 3C is a schematic side view of a CVD reactor showing a wafer of which the substrate forms part mounted on the susceptor 150 of the reactor.

FIGS. 3D–3F are enlarged side views of part of the substrate shown in FIG. 3A during the growth of a nanowire having a uniform cross-sectional area along its length using a chemical vapor deposition process.

DETAILED DESCRIPTION

Figure 1:
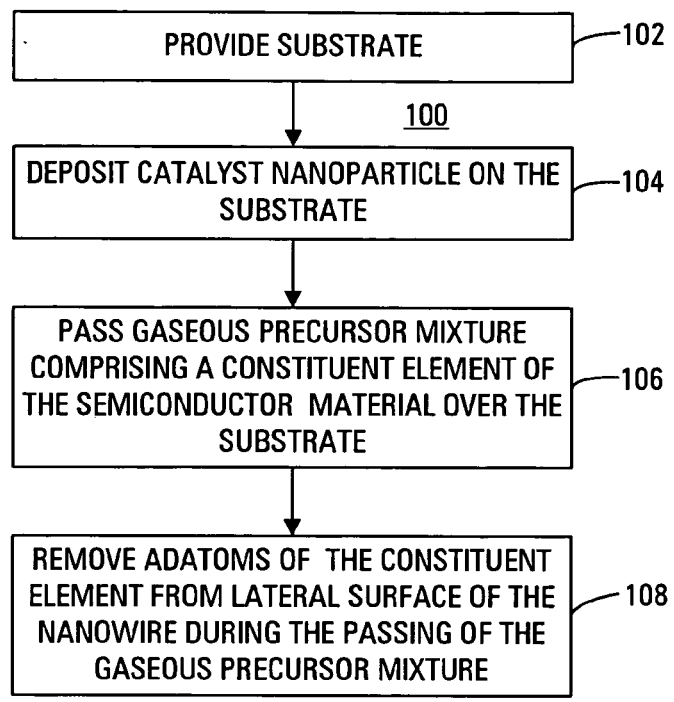
FIG. 1 is a flow chart illustrating a first embodiment of a method in accordance with the invention for using a chemical vapor deposition process to grow a nanowire of a semiconductor material. The nanowire has a uniform cross-sectional area along its length.

FIG. 1 is a flow chart illustrating a first embodiment 100 of a method in accordance with the invention for using a chemical vapor deposition (CVD) process such as metal-organic chemical vapor deposition (MOCVD) to grow a nanowire of a semiconductor material. The nanowire has a uniform cross-sectional area along its length.

In block 102, a substrate is provided.

In block 104, a catalyst nanoparticle is deposited on the substrate.

In block 106, a gaseous precursor mixture comprising a constituent element of the semiconductor material of the nanowire is passed over the substrate.

In block 108, adatoms of the constituent element are removed from a lateral surface of the nanowire during the passing of the precursor mixture.

In an embodiment, in block 108, the adatoms of the constituent element are removed by additionally passing a gaseous etchant over the substrate.

In another embodiment, in block 108, the adatoms of the constituent element are removed by the gaseous precursor mixture comprising a halogen-containing precursor.

Figure 2:
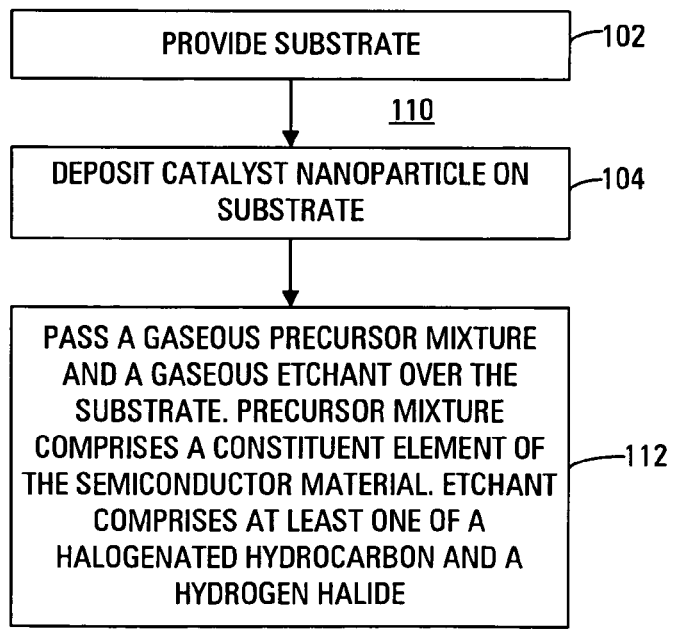
FIG. 2 is a flow chart illustrating a second embodiment of a method in accordance with the invention for using a chemical vapor deposition process to grow a nanowire of a semiconductor material. The nanowire has a uniform cross-sectional area along its length.

FIG. 2 is a flow chart illustrating a second embodiment 110 of a method in accordance with the invention for using a chemical vapor deposition (CVD) process such as metal-organic chemical vapor deposition (MOCVD) to grow a nanowire of a semiconductor material. The nanowire has a uniform cross-sectional area along its length. Blocks 102 and 104 are the same as the like-numbered blocks in first embodiment 100 and so will not be described again here. In block 112, a gaseous precursor mixture and a gaseous etchant are passed over the substrate. The precursor mixture comprises a constituent element of the semiconductor material. The etchant comprises at least one of a halogenated hydrocarbon and a hydrogen halide.

Embodiments 100 and 110 will now be described in more detail with reference to FIGS. 3A–3F. The following description refers to an example in which a nanowire of a single-element semiconductor material is grown, but can be readily extended to examples in which a nanowire of compound semiconductor materials are grown.

FIG. 3A is a side view of a substrate 120 on which the nanowire will be grown. Substrate 120 has a major surface 122. In an embodiment, substrate 120 is composed of a layer 124 of single-crystal silicon having a layer 126 of silicon dioxide on its major surface 128. Examples of other suitable materials for layer 124 are gallium arsenide (GaAs) and indium phosphide (InP). In an embodiment, layer 126 is a layer of native oxide formed by heating silicon layer 124 to a high temperature in an oxidizing atmosphere. Alternatively, layer 126 is deposited on major surface 128 of silicon layer 124 by a deposition process such as plasma-enhanced chemical vapor deposition (PECVD). Substrate 120 is typically a portion of a silicon wafer that is later singulated into hundreds or thousands of substrates 120.

FIG. 3B is a side view of substrate 120 showing a nanoparticle 130 of a catalyst material deposited on the major surface 122 of the substrate. A single nanoparticle is shown to simplify the drawing. Nanoparticle 130 is a nanoparticle of a catalytic material capable of catalytically decomposing a gaseous precursor to release the constituent element of the semiconductor material of which the nanowire will be grown. In an embodiment, nanoparticle 130 is a nanoparticle of colloidal gold. Examples of other suitable catalytic materials are iron (Fe), nickel (Ni), titanium (Ti) and other transition metals. The size of nanoparticle 130 determines the diameter of the nanowire. In an embodiment, nanoparticle 130 had an average diameter in the range from about 5 nm to about 20 nm.

FIG. 3C is a schematic side view of a CVD reactor 152 showing a wafer 140 of which substrate 120 forms part mounted on the susceptor 150 of the reactor. Susceptor 150 and, hence, substrate 120 and nanoparticle 130, are heated to a growth temperature near the eutectic point of an alloy between the material of the nanoparticle and the constituent element of the nanowire. In an embodiment in which the material of nanoparticle 130 was gold, the nanoparticle was heated to a growth temperature of about 450° C.

A growth pressure is established inside reactor 152 and a gaseous precursor mixture and a gaseous etchant are passed over substrate 120. The gaseous precursor mixture is represented by solid arrows, an exemplary one of which is shown at 160, and will be referred to as gaseous precursor mixture 160. Gaseous precursor mixture 160 is composed of a substantially inert carrier gas and one or more precursors in a gaseous state. In an embodiment in which the semiconductor material of the nanowire is composed of a single constituent element, the gaseous precursor mixture is composed of the carrier gas and a single precursor that comprises the constituent element. In an embodiment in which the semiconductor material of the nanowire is a compound semiconductor, i.e., a semiconductor composed of more than one constituent element, the gaseous precursor mixture is composed of the carrier gas and one or more precursors that collectively comprise the constituent elements of the compound semiconductor material. Typically, such gaseous precursor mixture has a different precursor for each constituent element of the compound semiconductor material. The gaseous etchant passed over substrate 120 is represented by broken arrows, an exemplary one of which is shown at 162, and will be referred to as gaseous etchant 162. The precursor (s) and the gaseous etchant are in a gaseous state at the growth temperature and growth pressure. Arrows 160 and 162 are shown separately for clarity. In practice, precursor mixture 160 and gaseous etchant 162 are thoroughly mixed.

Referring now to FIG. 3D, molecules of the precursor in gaseous precursor mixture 162 that contact nanoparticle 130 are catalytically decomposed by the material of the nanoparticle and the adatoms of the constituent element resulting from the decomposition are deposited on the surface 132 of the nanoparticle. The deposited adatoms mix with the original material of the nanoparticle to form an alloy. The alloy has a lower melting point than the original material of the nanoparticle.

Figure 4A:
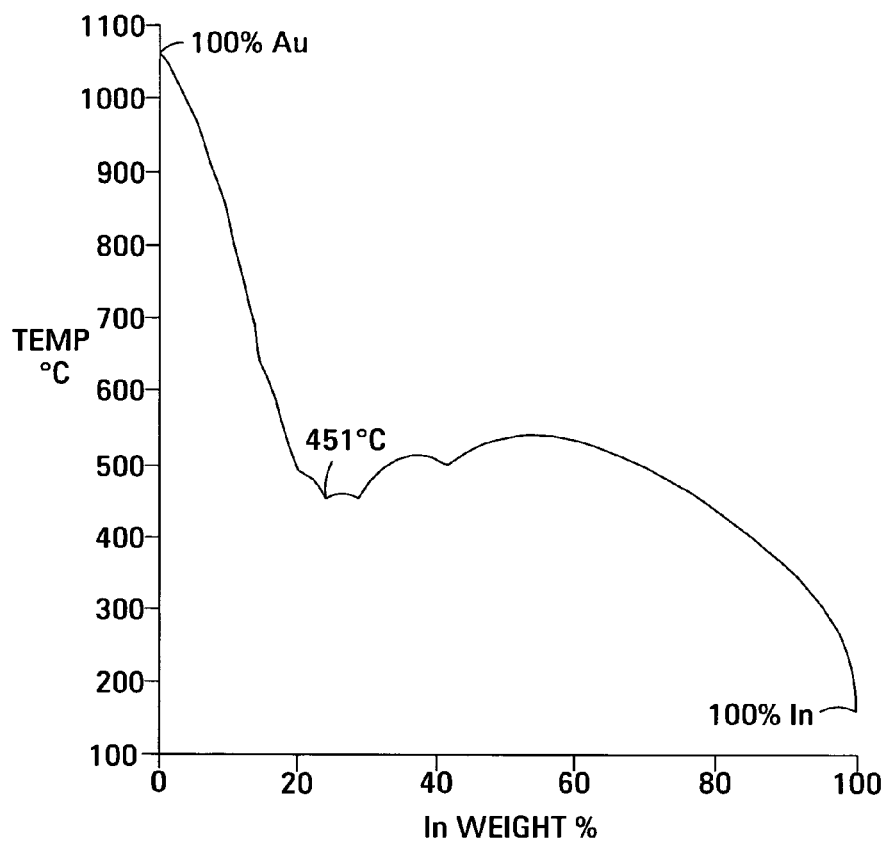
FIG. 4A is a simplified gold-indium phase diagram.

FIG. 4A is a phase diagram showing how the melting point of an exemplary alloy formed when adatoms of indium are deposited on the surface of a gold nanoparticle varies with the indium fraction in the alloy. Temperature is plotted against the indium fraction in the phase diagram. It can be seen that, as the indium fraction increases, the melting point of the alloy progressively decreases to about 451° C. at an indium fraction of about 20%.

Figure 4B:
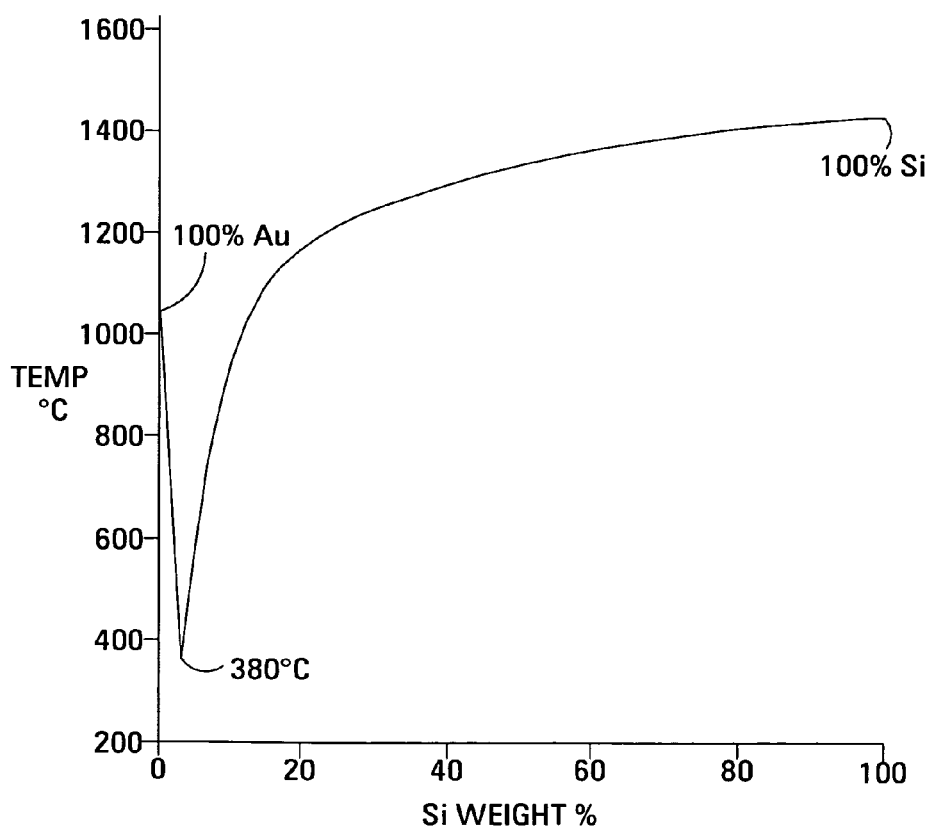
FIG. 4B is a gold-silicon phase diagram.

FIG. 4B is a phase diagram showing how the melting point of an exemplary alloy formed when adatoms of silicon are deposited on the surface of a gold nanoparticle varies with the silicon fraction in the alloy. Temperature is plotted against the silicon fraction in the phase diagram. It can be seen that, as the silicon fraction increases, the melting point of the alloy progressively decreases to about 380° C. at a silicon fraction of about 5%.

As a result of the fall in its melting point, nanoparticle 130 melts to form a molten nanoparticle, as shown in FIG. 3D.

Referring now to FIG. 3E, additional adatoms of the constituent element deposited on surface 132 of molten nanoparticle 130 increase the fraction of the constituent element in the alloy until the molten alloy becomes saturated with the constituent element. Then, further adatoms of the constituent element cause a corresponding number of atoms of the constituent element to be released from the molten nanoparticle at its surface adjacent substrate 120. The released atoms form a solid nanowire 170 that extends between molten nanoparticle 130 and substrate 120.

Further deposition of adatoms of the constituent element on molten nanoparticle 130 cause the release of additional atoms from the molten nanoparticle and an increase in the length of nanowire 170, as shown in FIG. 3F. The process of passing gaseous precursor mixture 160 and gaseous etchant 162 over substrate 120 is continued until nanowire 170 reaches its desired length. Throughout the growth of nanowire 170, nanoparticle 130 remains at its extreme end, remote from substrate 120.

Nanowire 170 has a lateral surface 172 that, during the growth of the nanowire, is also exposed to gaseous precursor mixture 160 and gaseous etchant 162. Some of the molecules of the precursor contained in mixture 160 that contact lateral surface 172 decompose non-catalytically and deposit respective adatoms of the constituent element on the lateral surface. An exemplary adatom of the constituent element deposited on lateral surface 172 is shown at 180.

In the absence of gaseous etchant 162, such adatoms would accumulate on lateral surface 172 and would impair the uniformity of the cross-sectional area of nanowire 170 along its length. The rate of lengthways growth of nanowire 170 is substantially constant, so the time that an annular segment of lateral surface 172 is exposed to gaseous precursor mixture 160 is inversely proportional to the distance of the annular segment from major surface 122. Consequently, adatoms 180 accumulated on lateral surface 172 would, if not removed, cause nanowire 170 to have the tapered shape known to result when a nanowire is conventionally grown by a CVD process, as described above in the Background section.

However, in accordance with the invention, adatoms 180 of the constituent element of the semiconductor material of nanowire 170 are removed from the lateral surface 172 of the nanowire. Since the adatoms of the constituent element are removed from lateral surface 172 as they are deposited during growth of nanowire 170 and before they incorporate into the lattice of the semiconductor material of the nanowire, nanowire 170 grows with a uniform cross-sectional area along its entire length, as shown in FIG. 3F.

In accordance with an embodiment of the invention, the adatoms of the constituent element are removed from lateral surface 172 of nanowire 170 by passing gaseous etchant 162 over substrate 120 in addition to gaseous precursor mixture 160. Gaseous etchant 162 is an etchant that forms a volatile compound with adatoms 180 of the constituent element deposited on the lateral surface 172. The compound is volatile at the growth temperature and growth pressure established inside reactor 152. Molecules of the volatile compound are carried away from lateral surface 172 into the exhaust system 154 of reactor 152 by the gases passing over substrate 120. An exemplary molecule of the volatile compound formed between gaseous etchant 162 and an adatom released from gaseous precursor mixture 160 at lateral surface 172 is shown at 182. The etch rate of the adatoms deposited on lateral surface 172 is several orders of magnitude greater than that of the crystalline material of the lateral surface itself. As a result, the gaseous etchant removes the adatoms but has a negligible etching effect on lateral surface 172.

In an embodiment, gaseous etchant 162 was a halogenated hydrocarbon, such as halogenated methane. In one example, the halogenated methane was carbon tetrabromide ($CBr_4$). In another example, the halogenated methane was carbon tetrachloride ($CCl_4$). Not all the hydrogen atoms of the halogenated hydrocarbon or the halogenated methane need be substituted. Moreover, ones of the hydrogen atoms may be replaced by different halogens. In another embodiment, gaseous etchant 162 was a hydrogen halide (HX), where X=fluorine (F), chlorine (Cl), bromine (Br) or iodine (I).

Compound semiconductor materials, such as Group III–V semiconductor materials or Group II–VI semiconductor materials, may advantageously be used as the material of nanowire 170. In an embodiment of the method in accordance with the invention suitable for growing a nanowire of a compound semiconductor material by chemical vapor deposition, the gaseous precursor mixture passed over substrate 120 in block 106 of method 100 shown in FIG. 1 and in block 112 of method 110 shown in FIG. 2, and in FIGS. 3D–3F comprises the constituent elements of the compound semiconductor material. In block 108 of FIG. 1 and FIGS. 3E and 3F, adatoms of at least one of the constituent elements are removed from the lateral surface of the nanowire. In a group III–V compound semiconductor material, adatoms of the group III constituent element are typically removed. In an embodiment, in block 112 of FIG. 2 and in FIGS. 3E and 3F, the adatoms are removed by additionally passing a gaseous etchant over the substrate.

In another embodiment, the adatoms of one or more of the constituent elements are removed from lateral surface 172 of nanowire 170 by using a halogen-containing precursor as the precursor for at least one of the constituent elements. The halogen-containing precursor forms part of the gaseous precursor mixture passed over the substrate. The halogen-containing precursor is catalytically decomposed at the surface 132 of nanoparticle 130. Adatoms of the constituent element are deposited on surface 132 and the halogen is released into the precursor mixture. The carrier gas carries the halogen released from the halogen-containing precursor to lateral surface 172 of nanowire 170. Additional halogen may be released by non-catalytic decomposition of the halogen-containing precursor at the lateral surface. At lateral surface 172, the halogen combines with adatoms newly-deposited on the lateral surface to form a volatile compound. The carrier gas carries the volatile compound away from the lateral surface.

The growth process described above is continued until nanowire 170 reaches its desired length. An etch process using an etchant that is selective between the materials of nanowire 170 and nanoparticle 130 may optionally be performed to remove the nanoparticle from the end of the nanowire.

In a practical example of method embodiments 100 and 110 in which the material of nanowire 170 was a InAs/InP superlattice, the substrate provided in block 102 was as structured as described above and was part of a silicon wafer 140 having a diameter of 50 mm. Wafer 140 had a layer of silicon dioxide on its major surface as described above.

In block 104, nanoparticles of colloidal gold were deposited on the major surface of wafer 140 of which substrate 120 forms part as follows. A micropipette was used to measure out about 20 µl of an aqueous solution of colloidal gold. The solution of colloidal gold was mixed with about 30 µl of methanol and the resulting mixture was dropped onto the major surface of wafer 140. The mixture rapidly spreads over the surface of the wafer.

After evaporation of the liquid constituents of the mixture, a random distribution of gold nanoparticles remains on the surface of wafer 140. The nanoparticles had a diameter in a range from about 10 nm to about 20 nm.

The deposition process just described typically causes two or more particles of the colloidal gold to agglomerate in some locations on the wafer. Single particles remain in the remaining locations. As a result, the nanowires grown using the nanoparticles have a range of cross-sectional areas. The cross-sectional area of each nanowire depends on the number of particles of the colloidal gold constituting the nanoparticle used to grow the nanowire and the diameter of each particle. Techniques for depositing a catalytic nanoparticle of a defined size at a defined location on substrate 120 are known in the art and may be used to grow nanowires of defined diameters at defined locations on substrate 120.

The growth temperature to which susceptor 150 and, hence, substrate 120 and nanoparticle 130, were heated was about 450° C. and the growth pressure established in reactor 152 was about 10 kilopascals (kPa).

In block 106 of FIG. 1 and in block 112 of FIG. 2, and in FIGS. 3D–3F, gaseous precursor mixture 160 passed over substrate 120 was composed of hydrogen as the carrier gas; trimethylindium (TMI) as the precursor comprising indium; and arsine ($AsH_3$) as the precursor comprising arsenic or phosphine ($PH_3$) as the precursor comprising phosphorus. The flow rates of the constituents of the gaseous precursor mixture were $H_2$ carrier gas: 12 standard liters per minute; $H_2$ flow rate through the TMI bubbler of 25 standard cubic centimeters per minute (sccm), corresponding to $5\times10^{-7}$ mole of TMI per minute; arsine flow rate of 100 sccm, corresponding to $5\times10^{-3}$ mole of $AsH_3$ per minute; and phosphine flow rate of 200 sccm, corresponding to $9\times10^{-3}$ mole of $PH_3$ per minute.

Gaseous etchant 162 additionally passed over substrate 120 was carbon tetrabromide ($CBr_4$) with an $H_2$ flow rate through the $CBr_4$ bubbler of 25 sccm, corresponding to $9\times10^{-7}$ mole of $CBr_4$ per minute. The $CBr_4$ combines with the indium adatoms released from the TMI on the lateral surface 172 of nanowire 170 to produce indium bromide ($InBr_x$). Indium bromide is volatile at the growth temperature.

An $H_2$ flow rate through the $CBr_4$ bubbler greater than a threshold flow rate provides sufficient etchant to remove all adatoms from the lateral surface 172 of nanowire 170. At $H_2$ flow rates greater than the threshold flow rate, the $H_2$ flow rate has little effect on the uniformity of the cross-sectional area of nanowire 170 along its length. However, since the etchant additionally removes deposited adatoms of the semiconductor material of nanowire 170 from the surface 132 of nanoparticle 130, increasing the $H_2$ flow rate through the etchant bubbler reduces the rate of growth of nanowire 170. An $H_2$ flow rate of about 300 sccm reduces the rate of growth to zero and represents a maximum flow rate. Good cross-sectional uniformity and a fast growth rate are obtained with an $H_2$ flow rate above the threshold flow rate but well below the maximum flow rate.

The flows of phosphine and arsine into reactor 152 were alternated while the flows of TMI, $CBr_4$ and the carrier gas were maintained constant. A routine of a phosphine flow for 20 seconds and an arsine flow for 10 seconds was repeated 50 times, followed by a final phosphine flow for 20 seconds. This process produced an embodiment of nanowire 170 with an overall length of about 1.8 μm. The diameter of nanowire 170 was typically about 11 nm when grown using a 10 mm diameter gold nanoparticle 130 and about 23 nm when grown using a 20 mm diameter gold nanoparticle.

In another example in which the material of nanowire is silicon, gaseous precursor mixture 160 is composed of hydrogen as the carrier gas and disilane ($Si_2H_6$) as the precursor for silicon. The disilane is provided to reactor 152 at approximately 2% of the flow rate of the carrier gas. Carbon tetrabromide is provided to the reactor as the gaseous etchant. The growth temperature can be as low as about 380° C. (see FIG. 4B). Carbon tetrabromide reacts with adatoms of silicon deposited on lateral surface 172 of nanowire 170 to form silicon tetrabromide, which is in a gaseous state at the growth temperature.

In another example in which the material of nanowire is gallium arsenide, gaseous precursor mixture 160 is composed of hydrogen as the carrier gas, diethylgallium chloride $(C_2H_5)_2GaCl$ as a halogen-containing precursor for gallium and arsenic trichloride $AsCl_3$ as a halogen-containing precursor for arsenic. A growth temperature of about 500° C. is used. In this embodiment, catalytic decomposition of the halogen-containing precursors at surface 132 provides chlorine as gaseous etchant 162 that removes adatoms of gallium from lateral surface 172. The chlorine released from the chlorine-containing precursors reacts with adatoms of gallium deposited on lateral surface 172 to form gallium chloride, which is in a gaseous state at the growth temperature. A halogen-free precursor, such as trimethyl gallium (TMG) or arsine ($AsH_3$) may be substituted for one of the halogen-containing precursors exemplified above.

This disclosure describes the invention in detail using illustrative embodiments. However, the invention defined by the appended claims is not limited to the precise embodiments described.

I claim:

1. A method of growing a nanowire of semiconductor material, the nanowire having a constant cross-sectional area along its length, the method comprising:
   providing a substrate;
   depositing a catalyst nanoparticle on the substrate;
   passing a gaseous precursor mixture comprising a constituent element of the semiconductor material over the substrate; and
   removing adatoms of the constituent element from a lateral surface of the nanowire during the passing of the precursor mixture, the removing comprising passing over the substrate a gaseous etchant that forms a volatile compound with the adatoms, the gaseous etchant comprising a halogenated hydrocarbon.

2. The method of claim 1, in which the gaseous etchant comprises halogenated methane.

3. The method of claim 1, in which:
   the method additionally comprises heating the substrate to a growth temperature;
   the passing is performed at a growth pressure; and
   the gaseous precursor, the gaseous etchant and the volatile compound are gaseous at the growth temperature and the growth pressure.

4. A method of growing a nanowire of compound semiconductor material, the nanowire having a constant cross-sectional area along its length, the compo the method comprising:
   providing a substrate;
   depositing a catalyst nanoparticle on the substrate;
   passing a gaseous precursor mixture comprising the constituent elements of the compound semiconductor material over the substrate; and
   removing adatoms of at least one of the constituent elements from a lateral surface of the nanowire during the passing of the precursor mixture, the removing comprising passing over the substrate a gaseous etchant that forms a volatile compound with the at least one of the constituent elements, the gaseous etchant comprising a halogenated hydrocarbon.

5. The method of claim 4, in which the gaseous etchant comprises halogenated methane.

6. A method of growing a nanowire of compound semiconductor material, the nanowire having a constant cross-sectional area along its length, the compound semiconductor material comprising constituent elements, the method comprising:
providing a substrate;
depositing a catalyst nanoparticle on the substrate;
passing a gaseous precursor mixture comprising the constituent elements of the compound semiconductor material over the substrate, the constituent elements comprising indium, arsenic and phosphorus, the gaseous precursor mixture comprising trimethyl indium, arsine and phosphine; and
removing adatoms of at least one of the constituent elements from a lateral surface of the nanowire during the passing of the gaseous precursor mixture, the removing comprising passing over the substrate a gaseous etchant that forms a volatile compound with the adatoms, the gaseous etchant comprising a halogenated hydrocarbon.

7. A method of growing a nanowire of a semiconductor material, the nanowire having a constant cross-sectional area along its length, the method comprising:
providing a substrate;
depositing a catalyst nanoparticle on the substrate; and
passing a gaseous precursor mixture and a gaseous etchant over the substrate, the precursor mixture comprising a constituent element of the semiconductor material, the etchant comprising a halogenated hydrocarbon.

8. The method of claim 7, in which the gaseous etchant comprises halogenated methane.

9. The method of claim 7, in which the gaseous etchant comprises carbon tetrabromide.

10. The method of claim 7, in which:
the method additionally comprises heating the substrate to a growth temperature;
the passing is performed at a growth pressure; and
the gaseous precursor mixture and the gaseous etchant are gaseous at the growth temperature and the growth pressure.

11. The method of claim 7, in which:
the semiconductor material is a compound semiconductor material comprising constituent elements; and
the precursor mixture comprises the constituent elements.

12. The method of claim 11, in which the gaseous etchant comprises halogenated methane.

13. The method of claim 11, in which:
the constituent elements are indium, arsenic and phosphorus; and
the precursor mixture comprises trimethyl indium, arsine and phosphine.

14. The method of claim 13, in which the gaseous etchant comprises carbon tetrabromide.

15. A method of growing a nanowire of a compound semiconductor material, the nanowire having a constant cross-sectional area along its length, the compound semiconductor material having constituent elements, the method comprising:
providing a substrate;
depositing a catalyst nanoparticle on the substrate; and
passing a gaseous precursor mixture and a gaseous etchant over the substrate, the precursor mixture comprising the constituent elements of the compound semiconductor material, the constituent elements comprising indium, arsenic and phosphorus, the precursor mixture, comprising trimethyl indium, arsine and phosphine, the gaseous etchant comprising at least one of HCl and HBr.

16. The method of claim 11, in which the gaseous etchant comprises carbon tetrabromide.

* * * * *

UNITED STATES PATENT AND TRADEMARK OFFICE
CERTIFICATE OF CORRECTION

PATENT NO.       : 7,129,154 B2                                                                     Page 1 of 1
APPLICATION NO.  : 10/857191
DATED            : October 31, 2006
INVENTOR(S)      : Yi It is certified that error appears in the above-identified patent and that said Letters Patent is hereby corrected as shown below:

On the title page, in item (56), under "U.S. Patent Documents", in column 2, line 2, delete "216/2" and insert -- 216/002 --, therefor.

In column 8, line 52, in Claim 4, after "length," delete "the compo"

In column 10, line 31, in Claim 15, after "mixture" delete ","

Signed and Sealed this

Twentieth Day of February, 2007

JON W. DUDAS
*Director of the United States Patent and Trademark Office*